United States Patent
Mishina et al.

(10) Patent No.: US 7,138,618 B2
(45) Date of Patent: Nov. 21, 2006

(54) SOLID-STATE IMAGE PICKUP DEVICE AND IMAGE PICKUP CAMERA

(75) Inventors: Koji Mishina, Kanagawa (JP); Ryoji Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 201 days.

(21) Appl. No.: 10/778,410

(22) Filed: Feb. 13, 2004

(65) Prior Publication Data

US 2004/0159774 A1 Aug. 19, 2004

(30) Foreign Application Priority Data

Feb. 19, 2003 (JP) ............................ P2003-041617

(51) Int. Cl.
*H01L 27/00* (2006.01)
*H01L 31/062* (2006.01)
*H01L 31/0232* (2006.01)
*G01J 3/50* (2006.01)

(52) U.S. Cl. .................. 250/208.1; 250/226; 257/291; 257/294; 257/432

(58) Field of Classification Search ............. 250/208.1, 250/226; 257/291, 294, 431, 432
See application file for complete search history.

(56) References Cited

U.S. PATENT DOCUMENTS 6,518,640 B1 * 2/2003 Suzuki et al. ............... 257/432

2003/0179457 A1 * 9/2003 Dobashi et al. ............. 359/619

FOREIGN PATENT DOCUMENTS

JP 2001-237404 * 8/2001

* cited by examiner

*Primary Examiner*—Georgia Epps
*Assistant Examiner*—Pascal M. Bui-Pho
(74) *Attorney, Agent, or Firm*—Robert J. Depke; Rockey, Depke, Lyons & Kitzinger LLC

(57) ABSTRACT

A solid-state image pickup device 20 according to the present invention includes a plurality of light-receiving sensor portions 2 arrayed in the horizontal and vertical directions and interconnection layers of a plurality of layers formed through interlayer insulators so as to form opening portions $42_3$ at their portions corresponding to the respective light-receiving sensor portions 2, wherein the opening portions $42_3$ of the uppermost layer of the interconnection layer are shifted from the light-receiving sensor portions 2 toward the center of the image pickup area in any one direction of the horizontal direction or the vertical directions. Thus, it is possible to provide a solid-state image pickup device and an image pickup camera including this solid-state image pickup device capable of restraining shading while interconnection and layout of interconnection layers are being facilitated.

18 Claims, 10 Drawing Sheets

SOLID-STATE IMAGE PICKUP DEVICE AND IMAGE PICKUP CAMERA

BACKGROUND OF THE INVENTION

1. Field of the Invention

The present invention relates to a solid-state image pickup device and an image pickup camera including this solid-state image pickup device.

2. Description of the Related Art

A CCD (charge-coupled device) type solid-state image pickup device and a CMOS (complementary MOS (metal-oxide-semiconductor)) type solid-state image pickup device are known as solid-state image pickup devices.

FIG. 1 of the accompanying drawings is a schematic diagram showing an arrangement of a main portion of a CCD type solid-state imaging device according to the related art. As shown in FIG. 1, for example, a CCD type solid-state image pickup device, generally depicted by the reference numeral 71, includes an image pickup area comprising a semiconductor substrate 72, a plurality of light-receiving sensor portions 73 formed on the semiconductor substrate 72 in an XY-matrix fashion (i.e., in a two-dimensional fashion), a vertical transfer register 75 having a CCD structure in which a plurality of transfer electrodes 74 are arrayed through an insulating film in the vertical direction in response to each light-receiving sensor portion column, a light-shielding layer 76 formed on the whole area except the light-receiving sensor portion 73, a color filter 78 provided through a planar layer 77 and an on-chip microlens 79 disposed on the color filter 78 in response to each light-receiving sensor portion 73.

FIG. 2A is a schematic diagram showing a central portion of an image pickup area of an example of a CMOS type solid-state image pickup device according to the related art, and FIG. 2B is a schematic diagram showing a marginal portion of an image pickup area of an example of a CMOS type solid-state image pickup device according to the related art. As shown in FIGS. 2A and 2B, for example, a CMOS type solid-state image pickup device, generally depicted by the reference numeral 61, includes an image pickup area comprising a semiconductor substrate 62, a plurality of light-receiving sensor portions 63, composed of photodiodes, formed on the semiconductor substrate 62 in an XY-matrix fashion (i.e., in a two-dimensional fashion), a plurality of interconnection layers 65, in this example, first, second and third interconnection layers $65_1$, $65_2$, $65_3$ formed through an interlayer insulator 64, a color filter 67 formed through a planar layer 66 and on-chip microlenses 68 formed on the color filter 67 in response to the respective light-receiving units 63.

These solid-state image pickup devices 61, 71 have taken measures to restrain so-called shading in which sensitivity on the marginal portion of the image pickup area decreases more than that of the central portion of the image pickup area.

This "shading" will be described with reference to FIG. 3. As shown in FIG. 3, in the solid-state image pickup device, since an optical center of an optical system 53 consisting of optical lenses 51 and 52 is located on a central prolonged line of an image pickup area 58, when an exit pupil distance (i.e., distance between an exit pupil and the light-receiving sensor portion) is limited, although light $L_1$ is introduced at the central portion of the image pickup area 58 from the vertical direction, light $L_2$ which becomes incident on the marginal portion of the image pickup area 58 increases.

At present, most of solid-state image pickup devices include on-chip microlenses provided on respective pixels. In the marginal portion of the image pickup area in which incident light from the oblique direction increases, the center at which light is focused by the on-chip microlens is shifted from the center of the light-receiving sensor portion and a rate at which light is focused on the light-receiving sensor portion decreases, thereby resulting in sensitivity being lowered. This decrease of sensitivity progressively increases from the central portion of the image pickup area to the marginal portion of the image pickup area, which leads to the cause of the shading. The on-chip microlens has been shifted in order to restrain such shading.

FIG. 4 shows an on-chip microlens shift structure of a pixel portion of the image pickup area 58. In this solid-state image pickup device, the on-chip microlens in which the center of the light-receiving sensor portion 63 and the center of the on-chip microlens have been arrayed at the same pitch in the whole of the related-art image pickup area is shifted in the center direction of the image pickup area 58 relative to the light-receiving sensor portion 63 as shown by an arrow a in FIG. 4. Consequently, the center at which light is focused on the on-chip microlens 68 and the center of the light-receiving sensor portion 63 are made identical to each other to increase an optical focusing rate, thereby making it possible to restrain the shading. This technology is also described in cited patent reference 1.

Since most of the CCD type solid-state image pickup devices have only one interconnection layer, the distance from the light-receiving sensor portion 73 (semiconductor substrate 72) to the on-chip microlens 79 is relatively short as shown in FIG. 1. Hence, it can be expected that the shading can be sufficiently restrained by only shifting the on-chip microlens 79.

On the other hand, since the CMOS type solid-state image pickup device uses the interconnection layer as the interconnection of the MOS transistor circuit, as shown in FIGS. 2A and 2B, it has been customary to form the interconnection layer 65 as a plurality of layers [$65_1$ to $65_3$], and hence the distance between the light-receiving sensor portion 63 and the on-chip microlens 68 increases as compared with the CCD type solid-state image pickup device. As a result, it is unavoidable that light that has been focused by the on-chip microlens 68 will be interrupted by the interconnection layers 65 before it reaches the light-receiving sensor portion 65, and hence the optical focusing rate decreases. This decrease of the optical focusing rate becomes remarkable in the image pickup area at its marginal portion in which light that becomes incident from the oblique direction increases, which leads to the cause of shading. More specifically, in the case of the CMOS type solid-state image pickup device, as shown in FIG. 2A, since the incident light $L_1$ is introduced into the central portion of the image pickup area from the vertical direction, it is not interrupted by the interconnection layers 65 [$65_1$ to $65_3$] and can reach the light-receiving sensor portion 63. However, since the incident light $L_2$ is introduced into the marginal portion of the image pickup area from the oblique direction, it is interrupted by the interconnection layers 65 so that the optical focusing rate in which light is focused on the light-receiving sensor portion 63 decreases.

To solve this problem, there is proposed a method in which, as shown in FIG. 5, the CMOS type solid-state image pickup device has opening portions formed through the uppermost layer of the interconnection layer most distant from at least the light-receiving sensor portion, in this example, metal interconnection layers [$56_1$ to $56_3$] shifted relative to the light-receiving sensor portion 63 at the marginal portion of the image pickup area in the vertical and horizontal directions toward the central direction of the image pickup area to decrease the incident light $L_2$ interrupted by the interconnection layers 56 thereby to restrain the decrease of the optical focusing rate and to restrain the shading (see cited patent reference 2).

[Cited patent reference 1]

Japanese laid-open patent application No. 6-140609

[Cited patent reference 2]

Japanese laid-open patent application No. 2001-237404

In the solid-state image pickup device having a plurality of interconnection layers [$56_1$ to $56_3$], such as the CMOS type solid-state image pickup device, the on-chip microlenses are not electrically connected to other layers but a plurality of interconnection layers should be connected to each other electrically. Therefore, when the opening portions [$69_1$ to $69_3$] of the interconnection layers are shifted from the light-receiving sensor portions from the central direction of the image pickup area in both of the vertical and horizontal directions, this method makes restrictions imposed upon interconnection and layout of respective interconnection layers become very large, and hence this technique is difficult to realize.

SUMMARY OF THE INVENTION

In view of the aforesaid aspect, it is an object of the present invention to provide a solid-state image pickup device capable of restraining shading while it can facilitate interconnection and layout of respective interconnection layers and an image pickup camera including this solid-state image pickup device.

According to an aspect of the present invention, there is provided a solid-state image pickup device which is comprised of a plurality of light-receiving sensor portions arrayed in the horizontal and vertical directions and interconnection layers of a plurality of layers formed through an interlayer insulator so as to form opening portions at their portions corresponding to the respective light-receiving sensor portions, wherein opening portions of the uppermost layer of the interconnection layers are shifted from the light-receiving sensor portions toward the center of an image pickup area in one of the horizontal direction or the vertical direction.

In accordance with another aspect of the present invention, there is provided an image pickup camera which is comprised of a plurality of light-receiving sensor portions arrayed in the horizontal and vertical directions and interconnection layers of a plurality of layers formed through an interlayer insulator so as to form opening portions at their portions corresponding to the respective light-receiving sensor portions, wherein opening portions of the uppermost layer of the interconnection layers are shifted from said light-receiving sensor portions toward the center of an image pickup area in one of the horizontal direction or the vertical direction.

DESCRIPTION OF THE PREFERRED EMBODIMENTS

A solid-state image pickup device and an image pickup camera according to the embodiments of the present invention will be described below with reference to the drawings.

Figure 1:
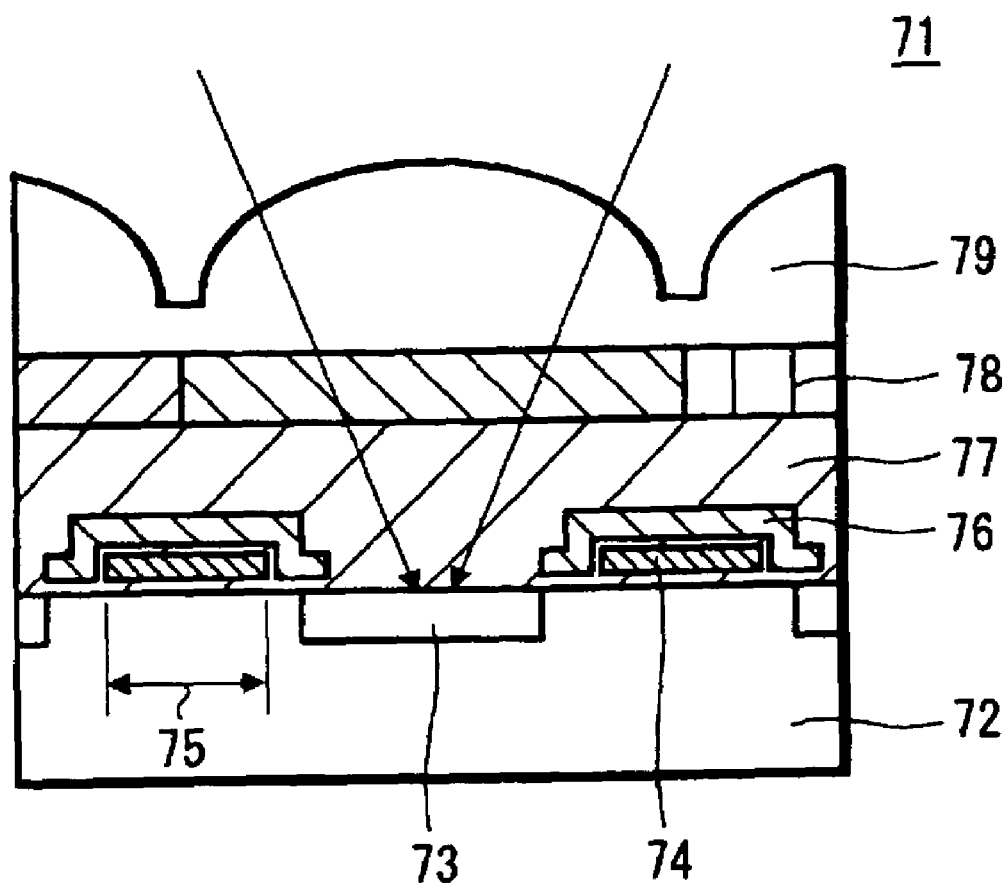
FIG. 1 is a schematic diagram showing an arrangement of a main portion of a CCD type solid-state image pickup device according to the related art.
Figure 2A:
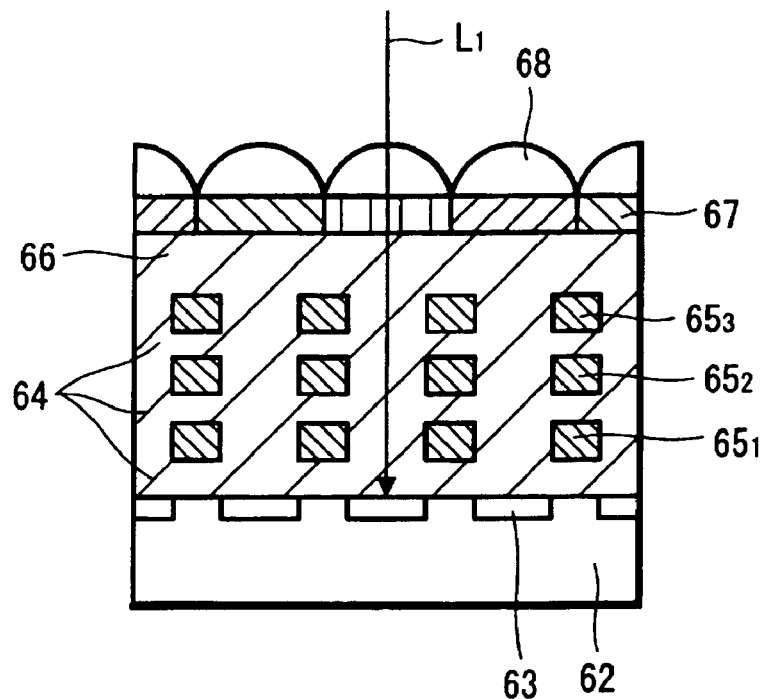
FIG. 2A is a schematic diagram showing an arrangement of a central portion of a CMOS type solid-state image pickup device according to the related art.
Figure 2B:
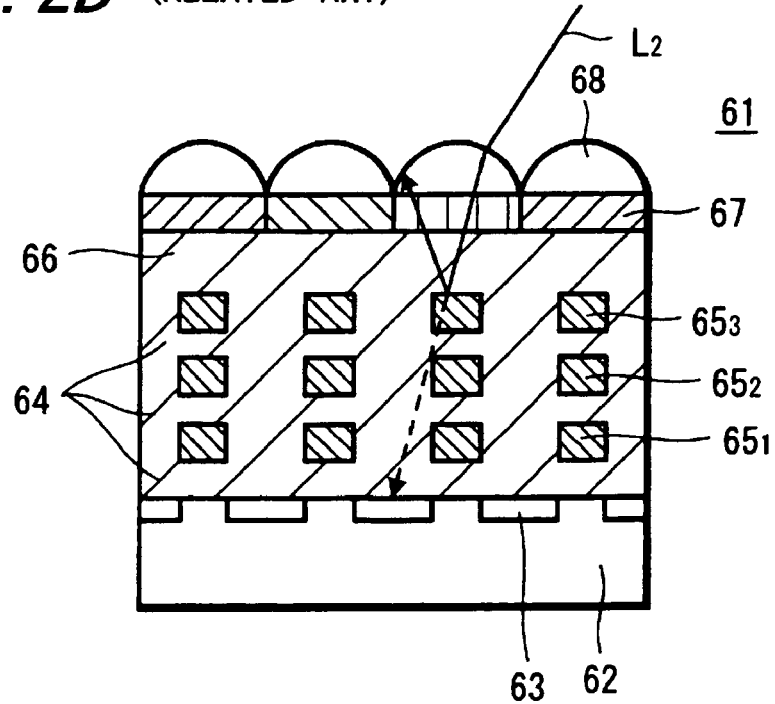
FIG. 2B is a schematic diagram showing an arrangement of a marginal portion of a CMOS type solid-state image pickup device according to the related art.
Figure 3:
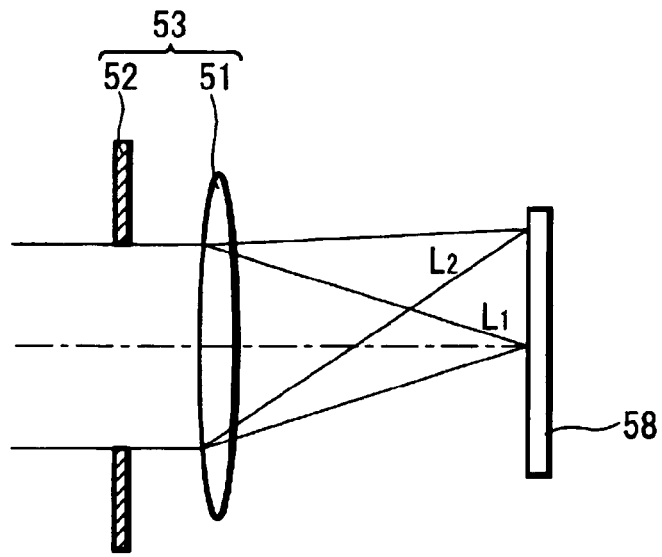
FIG. 3 is a schematic diagram to which reference will be made in explaining shading caused in the related-art CCD type solid-state image pickup device and CMOS type solid-state image pickup device.
Figure 4:
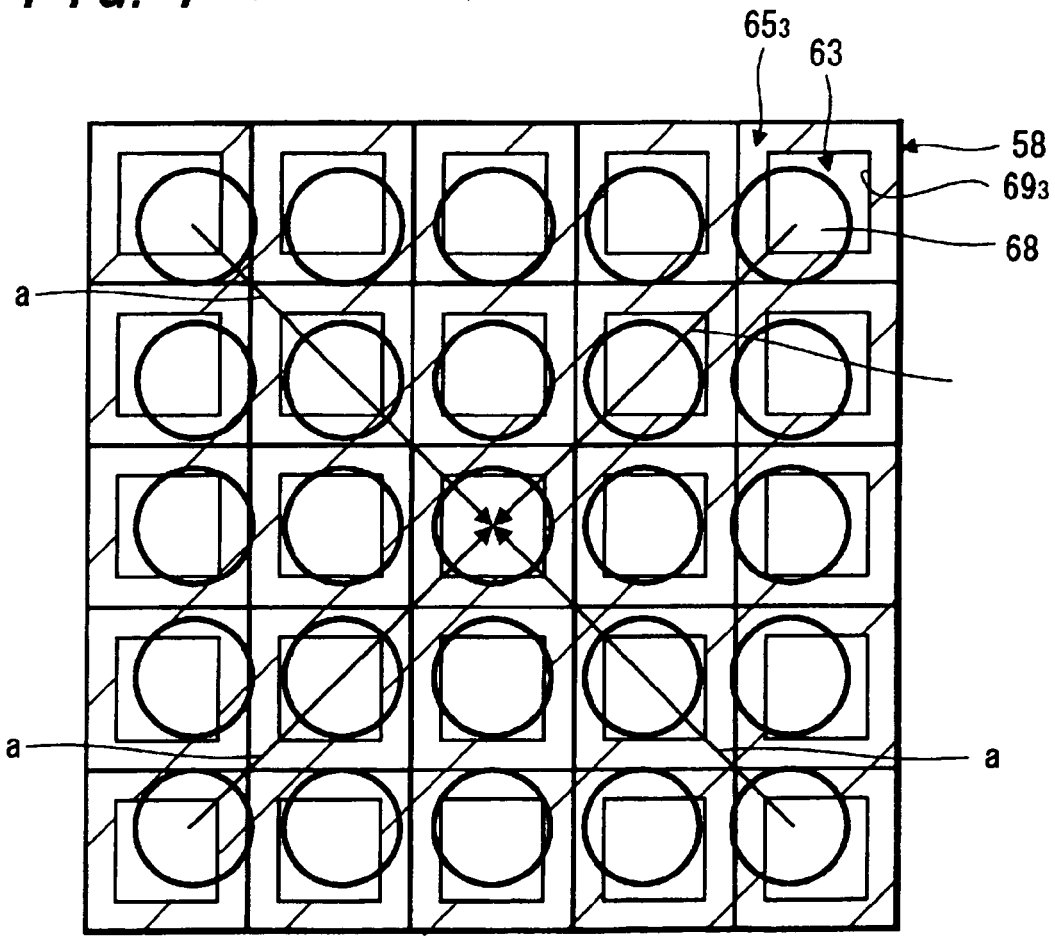
FIG. 4 is a plan view of an on-chip microlens shift structure used to restrain shading from being caused in the solid-state image pickup devices according to the related art.
Figure 5:
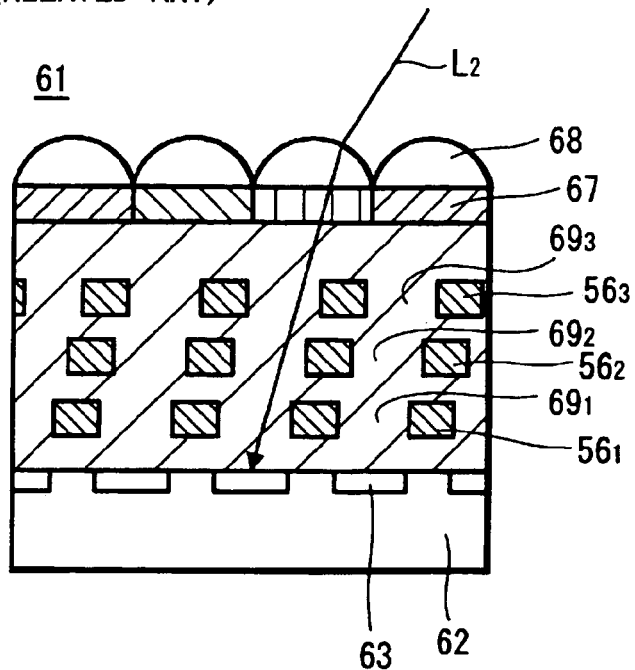
FIG. 5 is a schematic diagram showing another example of a solid-state image pickup device according to the related art.
Figure 6:
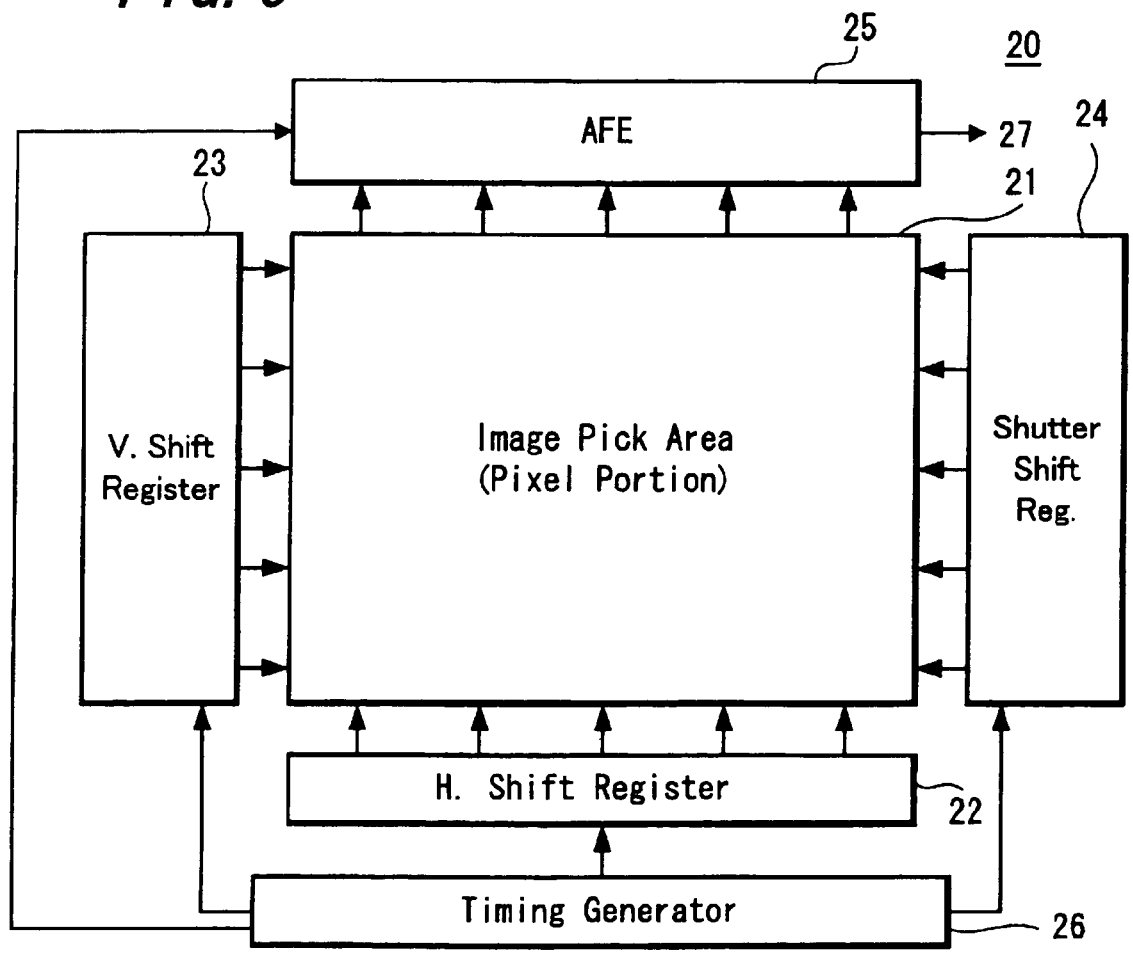
FIG. 6 is a schematic diagram showing a solid-state image pickup device according to an embodiment of the present invention.
Figure 7:
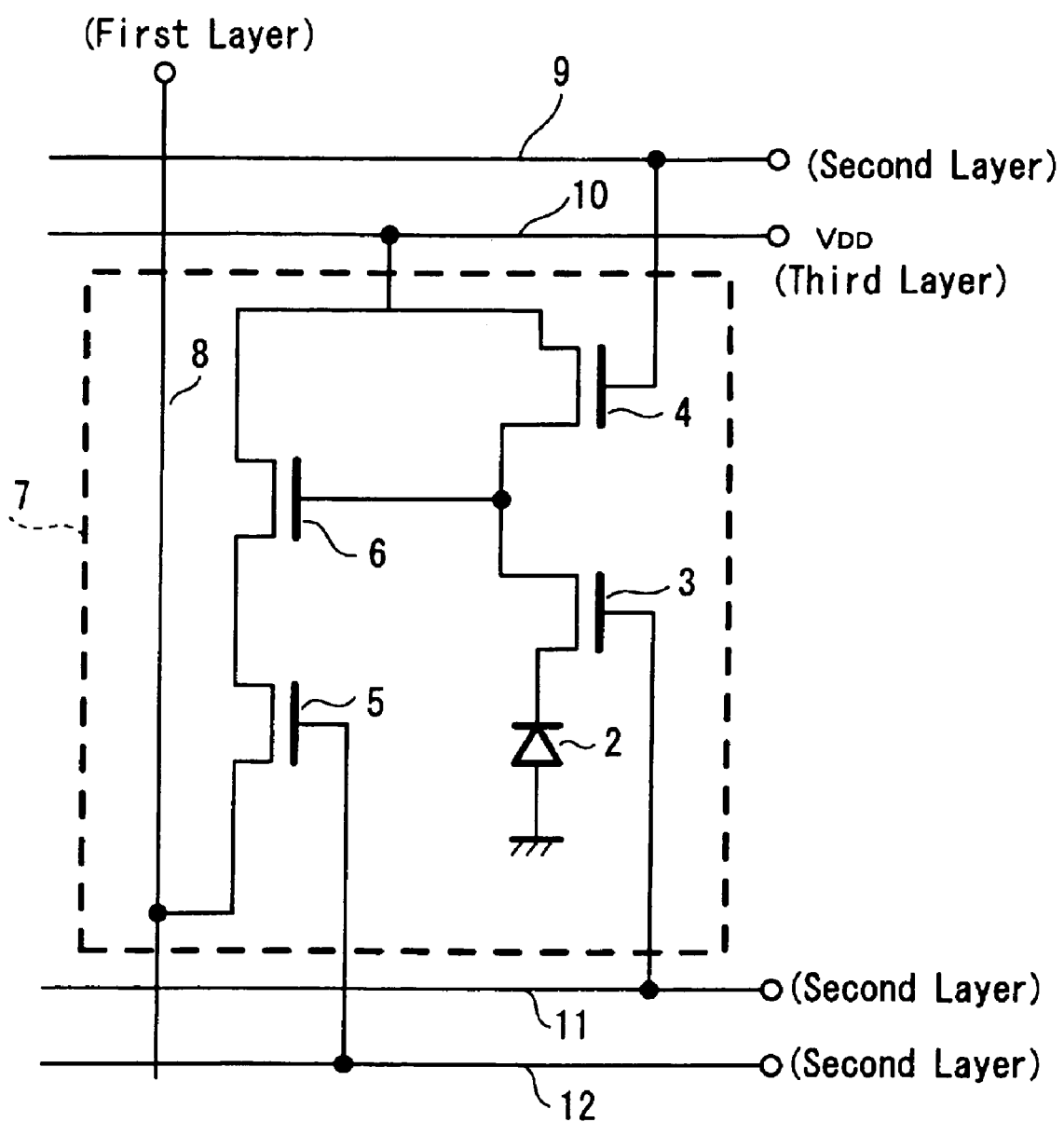
FIG. 7 is an equivalent circuit diagram showing an example of a unit pixel of the solid-state image pickup device according to the present invention.

FIGS. 6 to 9 show a solid-state image pickup device according to an embodiment of the present invention. A solid-state image pickup device according to this embodiment is applied to a so-called CMOS type solid-state image pickup device. FIG. 6 is a schematic diagram showing an arrangement of a CMOS type solid-state image pickup device 20 according to this embodiment. As shown in FIG. 6, the CMOS type solid-state image pickup device 20 includes an image pickup area (pixel portion) 21 composed of a plurality of unit pixels 7 arrayed in an XY-matrix fashion (i.e., in a two-dimensional fashion), the unit pixel 7 being consisting of a light-receiving sensor portion 2 and a plurality of MOS transistors 3 to 6 as shown in FIG. 7, for example. Marginal circuits for driving pixel portions and for processing signals are located around this image pickup area 21, and in the illustrated example, a horizontal shift register 22 comprising a horizontal scanning circuit for driving pixel portions, a vertical shift register 23 comprising a vertical scanning circuit and a shutter shift register 24 are located around the image pickup area 21. Further, an analog front end (AFE) 25 is located at the output side of the image pickup area 21 as shown in FIG. 6. The horizontal shift register 22, the vertical shift register 23, the shutter shift register 24 and the analog front end 25 are supplied with predetermined drive pulses from a timing generator 26.

In this CMOS type solid-state image pickup device 20, the vertical shift register 23 sequentially selects pixels of every horizontal line of the image pickup area 21, the horizontal shift register 22 sequentially selects pixels of every horizontal line of the image pickup area 21 and pixel signals are sequentially supplied to the analog front end 25, in which noises and image distortions are removed from these pixel signals and then resultant pixel signals are outputted as an output signal 27.

As shown in FIG. 7, the unit pixel 7 consists of a light-receiving sensor portion (i.e., photo-diode)2 for effecting photoelectric conversion, a read MOS transistor 3, a floating diffusion amplifier MOS transistor 6, a floating diffusion reset MOS transistor 4 and a vertical selection MOS transistor 5. One main electrode of the read MOS transistor 3 is connected to the light-receiving sensor portion 2 and the other main electrode of the read MOS transistor 3 is connected to one main electrode of the floating diffusion reset MOS transistor 4. The floating diffusion amplifier MOS transistor 6 is connected between the other main electrode of the floating diffusion reset MOS transistor 4 and one main electrode of the vertical selection MOS transistor 5. A gate electrode of the floating diffusion amplifier MOS transistor 6 is connected to a floating diffusion unit which is a connection point between the read MOS transistor 3 and the floating diffusion reset MOS transistor 4. A gate electrode of the read MOS transistor 3 is connected to a vertical read line 11, the other main electrode of the floating diffusion reset MOS transistor 4 is connected to a power supply line 10, i.e., a power supply VDD, its gate electrode is connected to a horizontal reset line 9, the other main electrode of the vertical selection MOS transistor 5 is connected to a vertical signal line 8, and its gate electrode is connected to a vertical selection line 12. The horizontal reset line 9, the vertical read line 11 and the vertical selection line 12 are connected to the vertical shift register 23, and the vertical signal line 8 is connected to the horizontal shift register 22.

Figure 8:
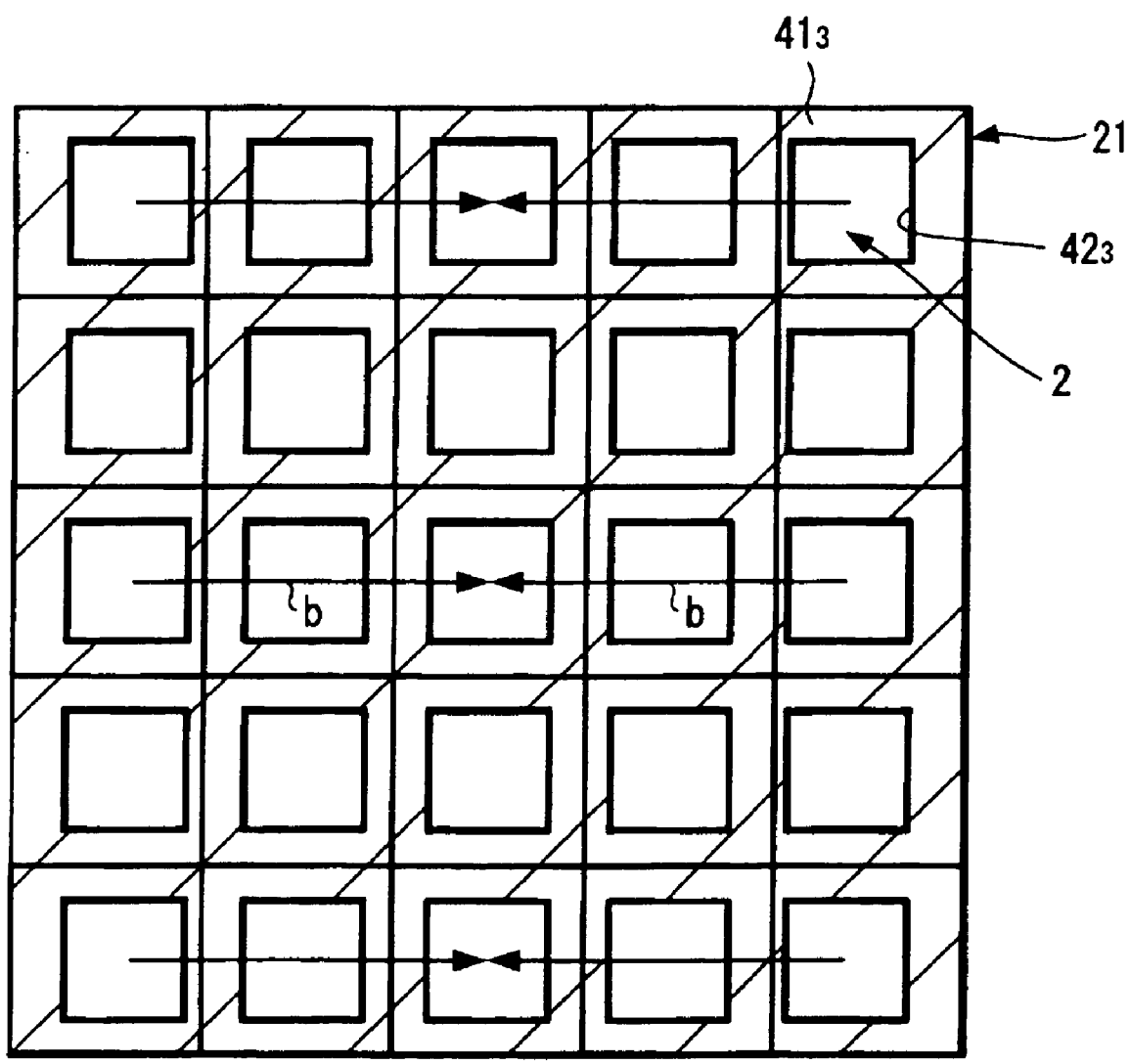
FIG. 8 is a plan view showing an image pickup area of the solid-state image pickup device according to the embodiment of the present invention.
Figure 9:
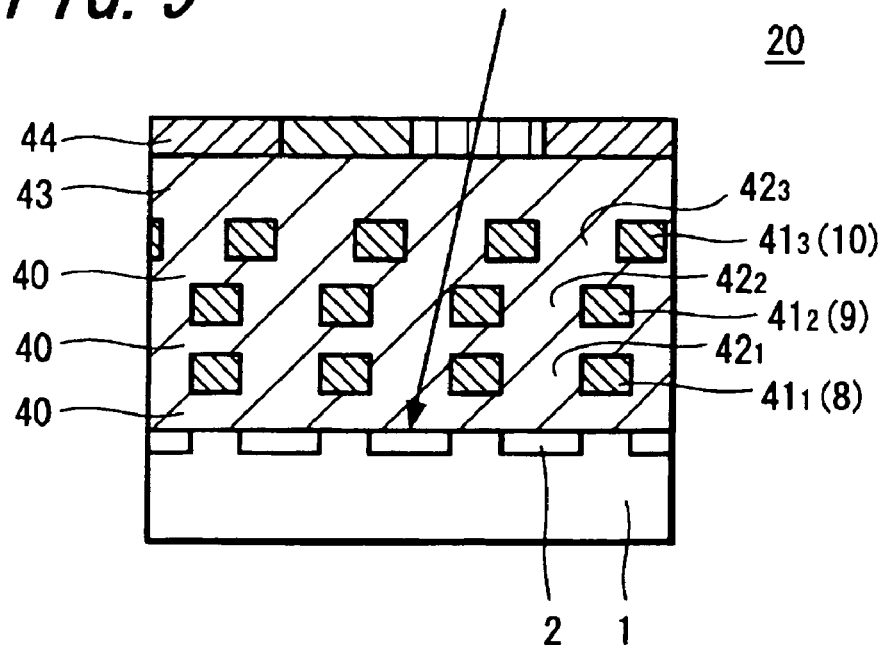
FIG. 9 is a cross-sectional view showing a main portion (marginal portion) of the image pickup area of the solid-state image pickup device according to the embodiment of the present invention.

FIG. 9 shows a schematic cross-sectional structure of a main portion (marginal portion which will be described later on) of the image pickup area 21 of the solid-state image pickup device 20 according to this embodiment. In the image pickup area 21, a plurality of light-receiving sensor portions 2 corresponding to respective pixels are formed on the semiconductor substrate 1. FIG. 9 shows only the light-receiving sensor portions 2 but the above-mentioned MOS transistors 3, 4, 5 and 6 are formed on the semiconductor substrate 1 at every pixel (although not shown). Interconnection layers of a plurality of layers, in this example, interconnection layers 41 [$41_1$, $41_2$, $41_3$] of three layers are formed on this semiconductor substrate 1 through interlayer insulators 40. The interconnection layers 41 of these respective layers correspond to the vertical signal line 8, the horizontal reset line 9, the power supply line 10, the vertical read line 11 or the vertical selection line 12 and further correspond to connection electrodes provided independently of these respective lines 8 to 12, i.e., connection electrodes among the respective lines 8 to 12 and the respective MOS transistors 3 to 5. In this example, the vertical signal line 8 corresponds to the interconnection layer $41_1$ of the first layer, and the horizontal reset line 9, the vertical read line 11 and the vertical selection line 12 correspond to the interconnection layer $41_2$ of the second layer. The vertical signal line 8 extending in one direction and the horizontal reset line 9, the vertical read line 11 and the vertical selection line 12 perpendicular to the vertical signal line 8 and which are extending in other direction are laid out around the respective light-receiving sensor portions 2 so as to form opening portions. In FIG. 9, opening portions $42_1$, $42_2$ are formed on the interconnection layers $41_1$, $41_2$ of the respective layers for the sake of convenience. On the other hand, the power supply line 10 corresponds to the interconnection layer $41_3$ of the third layer and is formed on the uppermost layer. As shown in FIG. 8, the power supply lines 10 are formed in a cross-stripes fashion so as to form the opening portions $42_3$ responsive to the light-receiving sensor portions 2. These interconnection layers 41 [$41_1$, to $41_3$] can serve as light-shielding layers as well. As shown in FIG. 9, a color filter 44 can be formed on the interlayer insulator of the uppermost layer of the image pickup area 21, i.e., so-called planar film 43. The manner in which the color filters 44 are arrayed may be of the primary color (red, green, blue) layer array.

Then, in this embodiment, in particular, as shown in FIGS. 8 and 9, only the opening portion $42_3$ of the uppermost layer $41_3$ of the interconnection layer is shifted from the light-receiving sensor portion 2 toward the center of the image pickup area 21 in either the horizontal direction or the vertical direction, in this embodiment, in the horizontal direction shown by an arrow b in FIG. 8. More specifically, the center of the opening portion $42_3$ of the interconnection layer $41_3$ is shifted from the center of the light-receiving sensor portion 2 toward the center of the image pickup area 21 in the horizontal direction. While the center of the opening portion $42_3$ of the interconnection layer $41_3$ is made identical to that of the light-receiving sensor portion 2 in the central portion of the image pickup area 21, the center of the opening portion $42_3$ of the interconnection layer $41_3$ and the center of the light-receiving sensor portion 2 are shifted from each other in the marginal portion of the image pickup area 21 as shown in FIGS. 8 and 9.

A shifted amount between the opening portion $42_3$ of the interconnection layer $41_3$ and the light-receiving sensor portion 2, i.e., a shifted amount should preferably be determined in consideration of the exit pupil distance and the size of the image pickup area 21. In addition, it is preferable that the shifted amount between the opening portion $42_3$ of the interconnection layer $41_3$ and the light-receiving sensor portion 2 progressively increases from the center of the image pickup area 21 toward the marginal portion of the image pickup area 21.

On the other hand, a problem of shading arises both in the horizontal direction and the vertical direction of the image pickup area 21. The shading becomes serious as the distance increases from the central portion of the image pickup area 21. Accordingly, when the number of pixels in the horizontal direction is larger than that of pixels in the vertical direction in a suitable television system such as the NTSC system, the shading in the horizontal direction becomes more serious.

In the solid-state image pickup device 20 according to this embodiment, having considered that the number of pixels in the horizontal direction becomes larger than that of pixels in the vertical direction, the opening portion $42_3$ of the uppermost layer $41_3$ of the interconnection layer is shifted from the light-receiving sensor portion 2 toward the center of the image pickup area 21 only in the horizontal direction.

According to this embodiment, a mask opening space of an exposure mask to form the interconnection layer $41_3$ of the third layer which serves as a power supply line may be shrunk so that it may progressively decrease toward the center of the image pickup area 21 in the horizontal direction, whereby the opening portion $42_3$ of the interconnection layer $41_3$ can be shifted in the horizontal direction.

Figure 10:
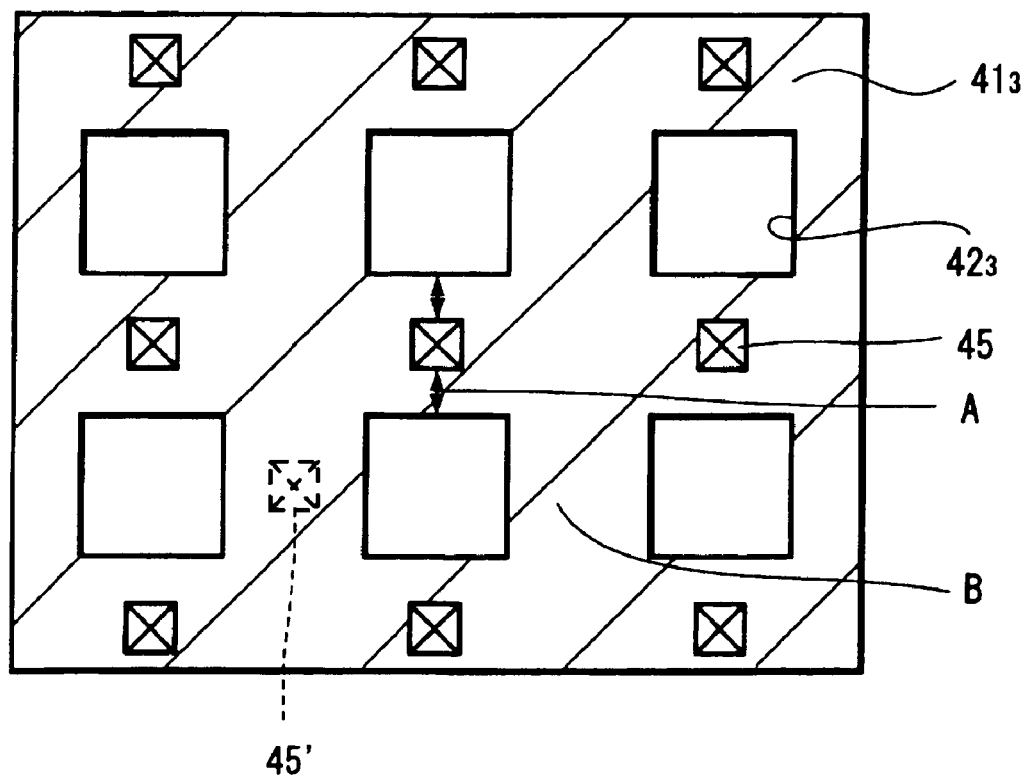
FIG. 10 is a plan view showing a layout of the image pickup area of the solid-state image pickup device according to the embodiment of the present invention.

When the mask opening space of the exposure mask is shrunk, the layout method also should be devised. In this embodiment, as shown in FIG. 10, the connection electrodes are electrically connected at one place per pixel between the opening portions $42_3$ of the pixels adjacent in the vertical direction. In other words, the uppermost layer $41_3$ of the interconnection layer serving as the power supply line and the interconnection layer $41_2$ of the second layer, i.e., in the case of FIG. 7, the connection electrode $41_2$ of the second layer formed at the same time the horizontal reset line 9, the read line 11 and the vertical selection line 12 connected from one source-drain region of the MOS transistors 4, 6 through the connection electrode $41_1$ of the first layer formed at the same time when the vertical signal line 8 is formed are formed is connected at a contact portion 45 between the opening portions $42_3$ of the adjacent pixels in the vertical direction. Thus, even when the mask opening space of the exposure mask to form the interconnection layer $41_3$ of the third layer is shrunk in the horizontal direction, a space A between the contact portion 45 with respect to the vertical direction and the opening portion $42_3$ of the interconnection layer $41_3$ is not changed, the layout rule can be kept. In this connection, when a contact portion 45' is formed between the opening portions $42_3$ of the interconnection layers $41_3$ adjacent in the horizontal direction as shown by a broken line in FIG. 10, it becomes difficult to keep the layout rule. In worst cases, it can be expected that satisfactory contact cannot be made.

According to the above-mentioned CMOS type solid-state image pickup device of this embodiment, only the opening portion $42_3$ of the uppermost layer $41_3$ of the interconnection layer is shifted from the light-receiving sensor portion 2 toward the center of the image pickup area 21 in the horizontal direction, whereby the shading in the horizontal direction can be restrained while the layout rule is being facilitated. In particular, when the opening portion $42_3$ of the interconnection layer $41_3$ is shifted much more in the horizontal direction in the marginal portion of the image pickup area 21, incident light can be irradiated on the light-receiving sensor portion 2 without being interrupted by the interconnection layers $41_2$, $41_1$ even in the marginal portion of the image pickup area 21. If the mask opening space of the exposure mask is shrunk so that it is progressively decreasing toward the center of the image pickup area 21 in the horizontal direction and thereby the interconnection layer $41_3$ of the third layer serving as the power supply line is formed, a few points should be changed from the existing technology and the shading can be restrained relatively easily. Also, the present invention can easily cope with a plurality of types of solid-state image pickup devices with different exit pupil distances.

Figure 11:
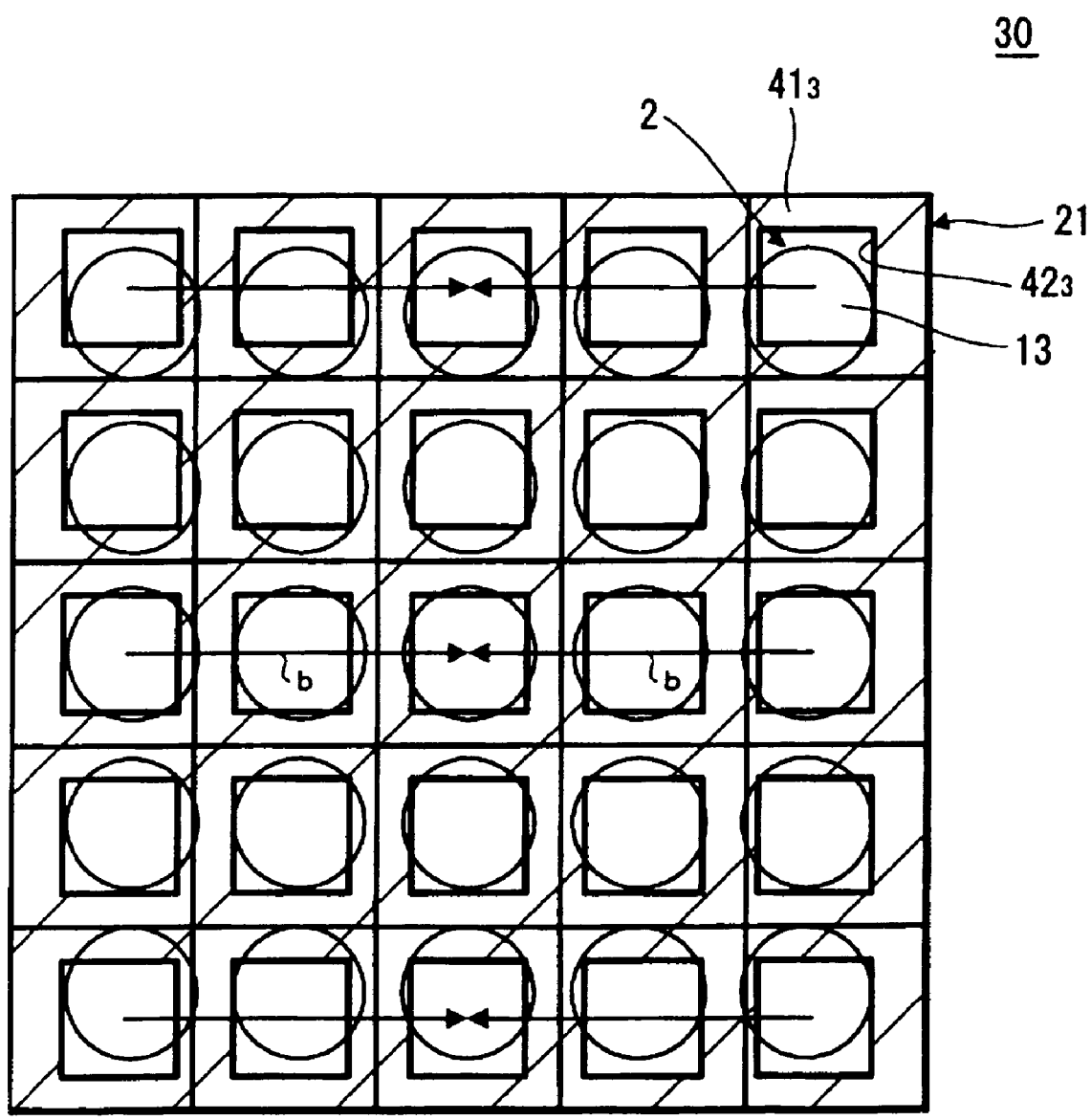
FIG. 11 is a plan view showing an image pickup area of a solid-state image pickup device according to another embodiment of the present invention.
Figure 12:
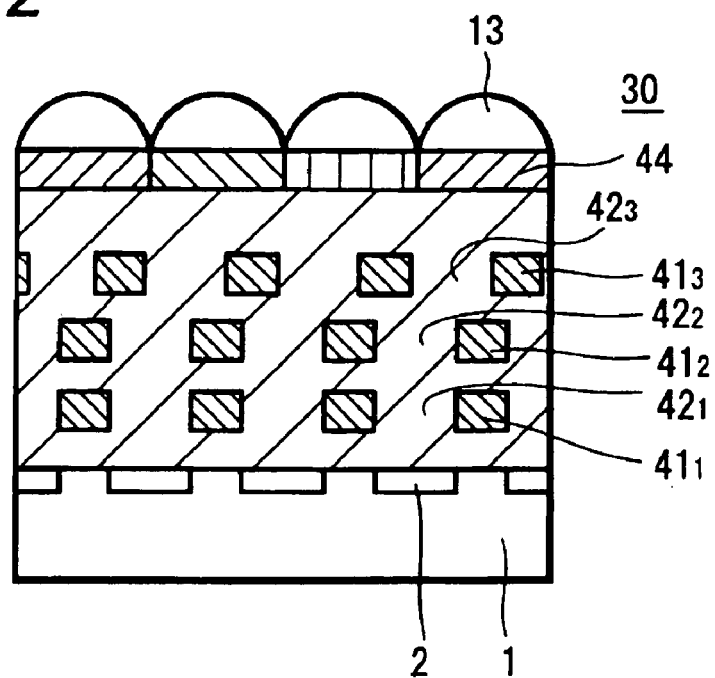
FIG. 12 is a plan view showing a main portion (marginal portion) of the image pickup area of the solid-state image pickup device according to another embodiment of the present invention.

FIGS. 11 and 12 show a CMOS type solid-state image pickup device according to another embodiment of the present invention. In FIGS. 11 and 12, elements and parts identical to those of FIGS. 8 and 9 are denoted by the identical reference numerals, and therefore need not be described in detail.

As shown in FIGS. 11 and 12, a solid-state image pickup device 30 according to this embodiment consists of a semiconductor substrate 1 with the light-receiving sensor portion 2 and the MOS transistors 4 to 6 formed thereon, the interconnection layers 41 [$41_1$, $41_2$, $41_3$] of the three layers formed on the semiconductor substrate 1 through the interlayer insulator 40, the color filter 44 formed through the planar film 43 and on-chip microlenses 13 formed on the color filter 44 at its positions corresponding to the respective light-receiving sensor portions 2.

Then, according to this embodiment, in particular, only the opening portion $42_3$ of the uppermost layer $41_3$ of the interconnection layer is shifted from the light-receiving sensor portion 2 toward the center of the image pickup area 21 either in the horizontal direction or the vertical direction, in this embodiment, in the horizontal direction shown by an arrow b in FIG. 11 similarly as mentioned before. At the same time, the on-chip microlens 13 is shifted from the light-receiving sensor portion 2 toward the center of the image pickup area 21. More specifically, the center of the opening portion $42_3$ of the interconnection layer $41_3$ is shifted from the center of the light-receiving sensor portion 2 toward the center of the image pickup area 21 in the horizontal direction. Also, the center of the on-chip microlens 13 is shifted from the center of the light-receiving sensor portion 2 toward the center of the image pickup area 21 either in the horizontal direction or the vertical direction.

It is preferable that the amount of the displacement between the opening portion $42_3$ of the interconnection layer $41_3$ the light-receiving sensor portion 2 may be progressively increasing from the center of the image pickup area 21 to the marginal portion of the image pickup area 21 and that the amount of the displacement between the on-chip microlens 13 and the light-receiving sensor portion 2 may be progressively increasing from the center of the image pickup area 21 to the marginal portion of the image pickup area 21. The shifted amount of the on-chip microlens 13 is changed with the same ratio both in the horizontal direction and the vertical direction. The shifted amount of the center of the opening portion $42_3$ of the interconnection layer $41_3$ toward the horizontal direction should preferably be made smaller than that of the center of the on-chip microlens 13. A rest of arrangement is similar to that which has been described so far with reference to FIGS. 6 to 9.

According to the solid-state image pickup device 30 of this embodiment, since only the opening portion $42_3$ of the uppermost layer $41_3$ of the interconnection layer is shifted from the light-receiving sensor portion 2 toward the center of the image pickup area 21 in the horizontal direction, light focused on the marginal portion of the image pickup area 21 by the on-chip microlens 13 can be restrained from being interrupted by the interconnection layers 41. Thus, similarly as mentioned before, while the layout rule is being kept, it is possible to restrain the shading in the horizontal direction. Also, similarly as mentioned before, there are a few changing points from the existing technology, and hence the shading can be restrained relatively easily. Furthermore, the present invention can easily cope with a plurality of types of solid-state image pickup devices with different exit pupil distances.

Figure 13:
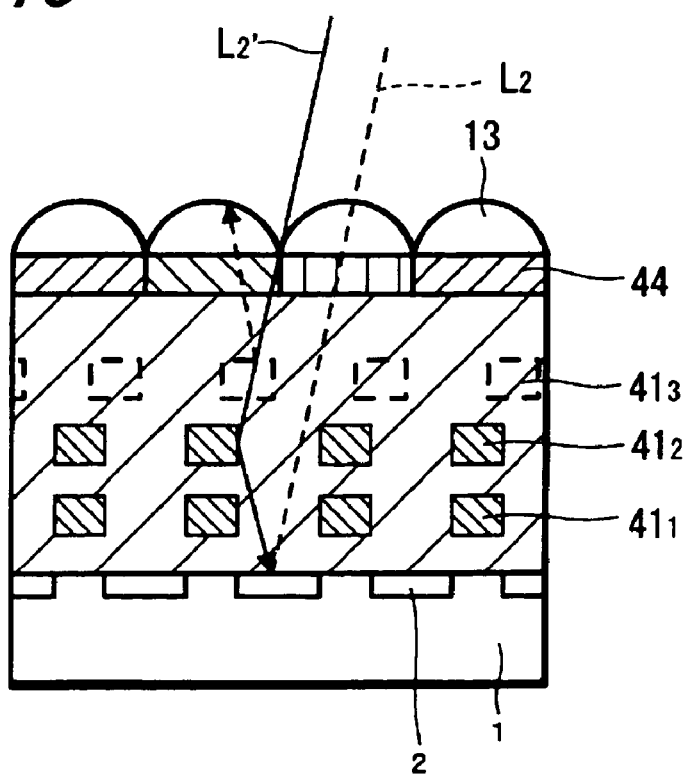
FIG. 13 is a schematic diagram useful for explaining mixture of colors occurred in the solid-state image pickup device according to the present invention.

Since the interconnection layer $41_3$ of the third layer is used as the power supply line 10 in the above-mentioned respective embodiments, even when this interconnection layer $41_3$ is formed as the interconnection layer $41_3$ in which an area B between the interconnection layers $41_3$ adjoining in the horizontal direction is removed as shown in FIG. 10 (however, the marginal portion is left), the transistor circuit can be operated, and hence it can be considered that the shading can be restrained. However, if this area B is removed, then as shown in FIG. 13, in the marginal portion of the image pickup area in which many lights $L_2$ become incident from the oblique direction, an incident light $L_2'$ from the adjacent pixel of other color leaks into the incident light $L_2$, which causes mixture of colors. Therefore, the interconnection layer $41_3$ should preferably be formed as the interconnection layer $41_3$ with the area B remaining.

In the solid-state image pickup device according to this embodiment, the shading can be restrained by shifting the opening portion $42_3$ of the uppermost layer $41_3$ of the interconnection layer toward the center of the image pickup area 21 only in the horizontal direction as described above. However, in this case, although the shading in the horizontal direction can be restrained sufficiently, the shading in the vertical direction cannot be restrained sufficiently. Accordingly, the shading in the vertical direction can be restrained by curving and mounting the chip of the image pickup device such that the image pickup area 21 may be curved in the vertical direction.

Figure 14:
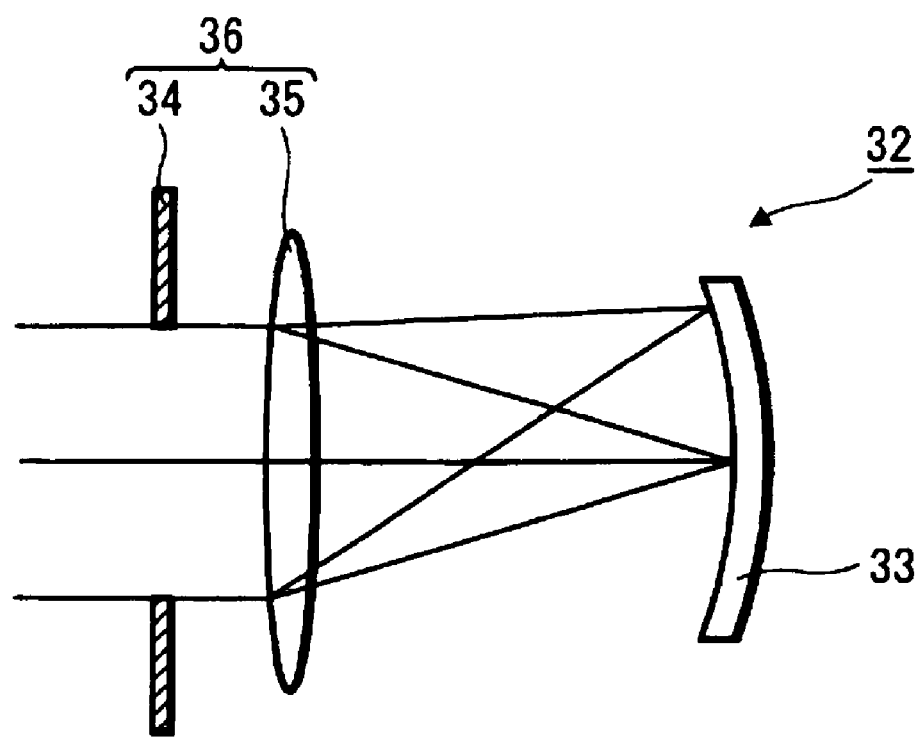
FIG. 14 is a schematic diagram used to explain the manner in which a solid-state image pickup chip is mounted on an optical system so as to be curved in the vertical direction in a solid-state image pickup device according to a further embodiment of the present invention.

FIG. 14 shows a CMOS type solid-state image pickup device in which the shading can be restrained by curving and mounting the chip of the image pickup device according to other embodiment of the present invention.

As shown in FIG. 14, a solid-state image pickup device 32 according to this embodiment has an arrangement similar to the aforementioned arrangement shown in FIGS. 11 and 12, i.e., an arrangement in which the opening portion $42_3$ of the uppermost layer $41_3$ of the interconnection layer is shifted from the light-receiving sensor portion 2 in any one direction of the horizontal direction or the vertical direction, in this embodiment, in the horizontal direction and the on-chip microlens 13 is shifted from the light-receiving sensor portion 2 in the horizontal direction. As shown in FIG. 14, a thus manufactured solid-state image pickup chip 33 is mounted on an optical system of an image pickup camera, i.e., an optical system 36 having an iris 34 and an optical lens 35 while it is being curved in the vertical direction such that shading in the vertical direction of the image pickup camera can be restrained, i.e., light incident on the marginal portion of the image pickup area can be properly introduced into the light-receiving sensor portion 2.

According to the solid-state image pickup device 32 of this embodiment, the shading in the horizontal direction can be restrained by shifting the opening portion $42_3$ of the interconnection layer $41_3$, and the shading in the vertical direction can be restrained by curving the solid-state image pickup chip 33 in the vertical direction. As a consequence, shading in the horizontal direction and the shading in the vertical direction can effectively be restrained on the whole of the image pickup area.

The on-chip microlens 13 can be shifted from the light-receiving sensor portion 2 in the horizontal and vertical directions. However, pupil correction effect becomes remarkable when the on-chip microlens 13 is not shifted in the curved direction but the on-chip microlens 13 is shifted in the direction in which it is not curved, in the above example, only in the horizontal direction.

In this connection, in order to restrain the shading in the horizontal direction and the shading in the vertical direction by utilizing only the arrangement in which the on-chip microlens 13 is mounted on the optical system 26 while it is being curved, the solid-state image pickup chip (semiconductor substrate) should be curved toward the center from every direction, which is difficult to be realized from a technology standpoint. On the other hand, according to the solid-state image pickup device 32 of this embodiment, the shading in the horizontal direction and the shading in the vertical direction can easily be restrained by the combination in which the uppermost layer $41_3$ of the interconnection layer is shifted in the horizontal direction and in which the solid-state image pickup chip 33 is mounted on the optical system 36 while it is being curved in the vertical direction.

The above-mentioned solid-state image pickup devices 20, 30, 32 according to the embodiments of the present invention can be assembled with the optical system to thereby construct an image pickup camera. Since the image pickup camera according to the embodiments of the present invention includes the solid-state image pickup device capable of restraining the shading while it can facilitate interconnection and layout of interconnection layers in the image pickup area, it is possible to provide a highly-reliable image pickup camera.

While the shading in the horizontal direction can be restrained by shifting the opening portion of the uppermost layer of the interconnection layer and the shading in the vertical direction can be restrained by mounting the solid-state image pickup chip on the optical system while it is being curved in the vertical direction as described above, the present invention is not limited thereto. Conversely, the shading in the horizontal direction may be restrained by mounting the solid-state image pickup chip on the optical system while it is being curved in the horizontal direction and the shading in the vertical direction may be restrained by shifting the opening portion of the uppermost layer of the interconnection layer. Furthermore, when the present invention is embodied, the layout of the interconnection layers following the second layer from above is not limited to the above embodiments, and the position of the interconnection layer of the second layer from above and the position of the interconnection layer of the third layer from above may be shifted from each other in a plane direction.

The present invention is not limited to the CMOS type solid-state image pickup device and can be applied to solid-state image pickup devices of other type including on-chip microlenses and interconnection layers.

According to the solid-state image pickup device of the present invention, the layout can be facilitated and the shading in one direction can be restrained by shifting the opening portion of the uppermost layer of the interconnection layer from the light-receiving sensor portion toward the center of the image pickup area in any one direction of the horizontal direction or the vertical direction.

When the shifted amount between the center of the opening portion of the uppermost layer of the interconnection layer and the center of the light-receiving sensor portion is progressively increasing from the center of the image pickup area to the marginal portion of the image pickup area, light incident on the marginal portion of the image pickup area can be more efficiently focused on the light-receiving sensor portion, and hence the shading can be restrained more preferably.

When the uppermost layer of the interconnection layer and the interconnection layer located right under the uppermost layer are electrically connected with each other between the opening portions adjoining in the direction perpendicular to the above one direction, the shading can be restrained while the layout rule of the above one direction is being facilitated.

Further, when the solid-state image pickup device includes microlenses in correspondence with respective light-receiving sensor portions, if the microlens is shifted from the light-receiving sensor portion toward the center of the image pickup area in either the horizontal direction or the vertical direction, then in combination with the effects achieved by shifting the uppermost layer of the interconnection layer, light focused by the microlens can efficiently be introduced into the light-receiving sensor portion, and hence the shading can be restrained efficiently.

When the shifted amount between the center of the microlens and the center of the light-receiving sensor portion is increasing progressively from the center of the image pickup area to the marginal portion of the image pickup area, light incident on the marginal portion of the image pickup area can more efficiently be focused on the light-receiving sensor portion, and hence the shading can be restrained more preferably.

When the shifted amount of the center of the opening portion of the uppermost layer of the interconnection layer is smaller than the shifted amount of the center of the microlens, light focused by the microlens can be introduced into the light-receiving sensor portion without being interrupted by the uppermost layer of the interconnection layer, and hence the shading can be restrained effectively.

When the opening portion of the uppermost layer of the interconnection layer is shifted in any one direction of the horizontal and vertical directions and the image pickup area is curved in any other direction of the vertical and horizontal directions, the shading on the whole area of the image pickup area can be restrained. When the microlens is shifted only in the above one direction and is not shifted in the above other direction, the pupil correction effect becomes more effective as compared with the case in which the microlens is shifted in the horizontal and vertical directions.

Since the image pickup camera according to the present invention includes the above-mentioned solid-state image pickup device, it is possible to provide an image pickup camera which is high in reliability.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state image pickup device comprising:
a plurality of light-receiving sensor portions arrayed in the horizontal and vertical directions; and
a plurality of interconnection layers formed with an interlayer insulator therebetween so as to provide opening portions at areas corresponding to said respective light-receiving sensor portions, wherein opening portions of the uppermost layer of said interconnection layers are shifted from said light-receiving sensor portions toward the center of an image pickup area in only one of said horizontal and said vertical directions.

2. A solid-state image pickup device according to claim 1, wherein an opening portion shifted amount, measured between a center of the opening portion of the uppermost layer of said interconnection layer and a center of said light-receiving sensor portion, progressively increases from a center of said image pickup area to a marginal portion of said image pickup area.

3. A solid-state image pickup device according to claim 1, wherein said uppermost layer of said interconnection layer and an interconnection layers located directly under said uppermost layer are electrically connected to each other between opening portions adjoining in a direction perpendicular to the direction in which said uppermost interconnection layer is shifted.

4. A solid-state image pickup device according to claim 1, further comprising microlenses formed in correspondence with said respective light-receiving sensor portions and wherein said microlens is shifted from said light-receiving sensor portion toward a center of said image pickup area.

5. A solid-state image pickup device according to claim 4, wherein a microlens shifted amount, measured between a center of said microlens and a center of said light-receiving sensor portion, progressively increases from a center of said image pickup area to a marginal portion of said image pickup area.

6. A solid-state image pickup device according to claim 5, wherein, for each sensor portion in the array, the opening portion shifted amount is smaller than the microlens shifted amount.

7. A solid-state image pickup device according to claim 1, wherein said image pickup area is curved in a direction perpendicular to the direction in which said uppermost interconnection layer is shifted.

8. A solid-state image pickup device according to claim 4, wherein said image pickup area is curved in a direction perpendicular to the direction in which said uppermost interconnection layer is shifted.

9. A solid-state image pickup device according to claim 1, further including microlenses formed in correspondence with said respective light-receiving sensor portions and wherein said microlenses are shifted from said light-receiving sensor portions toward a center of said image pickup area in only one of said horizontal direction and said vertical direction and said image pickup area is curved in the other of said vertical direction and said horizontal direction.

10. An image pickup camera comprising:
a plurality of light-receiving sensor portions arrayed in the horizontal and vertical directions; and
a plurality of interconnection layers formed with an interlayer insulator therebetween so as to provide opening portions at areas corresponding to said respective light-receiving sensor portions, wherein opening portions of the uppermost layer of said interconnection layers are shifted from said light-receiving sensor portions toward the center of an image pickup area in only one of said horizontal and vertical directions.

11. An image pickup camera according to claim 10, wherein an opening portion shifted amount, measured between a center of the opening portion of the uppermost layer of said interconnection layer and a center of said light-receiving sensor portion, progressively increases from a center of said image pickup area to a marginal portion of said image pickup area.

12. An image pickup camera according to claim 10, wherein said uppermost layer of said interconnection layer and an interconnection layer located directly under said uppermost layer are electrically connected to each other between opening portions adjoining in a direction perpendicular to the direction in which said uppermost interconnection layer is shifted.

13. An image pickup camera according to claim 10, further comprising microlenses formed in correspondence with said respective light-receiving sensor portions and wherein said microlens is shifted from said light-receiving sensor portion toward a center of said image pickup area.

14. An image pickup camera according to claim 13, wherein a microlens shifted amount, measured between a center of said microlens and a center of said light-receiving sensor portion, progressively increases from a center of said image pickup area to a marginal portion of said image pickup area.

15. An image pickup camera according to claim 14, wherein, for each sensor portion in the array, the opening portion shifted amount is smaller than the microlens shifted amount.

16. An image pickup camera according to claim 10, wherein said image pickup area is curved in a direction perpendicular to the direction in which said uppermost interconnection layer is shifted.

17. An image pickup camera according to claim 13, wherein said image pickup area is curved in a direction perpendicular to the direction in which said uppermost interconnection layer is shifted.

18. An image pickup camera according to claim 10, further including microlenses formed in correspondence with said respective light-receiving sensor portions and wherein said microlenses are shifted from said light-receiving sensor portions toward a center of said image pickup area in only one of said horizontal direction and said vertical direction and said image pickup area is curved in the other of said vertical direction and said horizontal direction.

* * * * *